United States Patent [19]

Lee

[11] Patent Number: 5,801,086
[45] Date of Patent: Sep. 1, 1998

[54] PROCESS FOR FORMATION OF CONTACT CONDUCTIVE LAYER IN A SEMICONDUCTOR DEVICE

[75] Inventor: Chang Jae Lee, Chungcheongbuk-do, Rep. of Korea

[73] Assignee: LG Semicon Co., Ltd., Cheongju, Rep. of Korea

[21] Appl. No.: 893,739

[22] Filed: Jul. 11, 1997

Related U.S. Application Data

[63] Continuation of Ser. No. 547,505, Oct. 24, 1995, abandoned.

[30] Foreign Application Priority Data

Oct. 24, 1994 [KR] Rep. of Korea ............ 94-27132

[51] Int. Cl.$^6$ .................................................. H01L 21/28
[52] U.S. Cl. .................... 438/558; 438/659; 438/661; 438/664; 438/683
[58] Field of Search ........................... 438/583, 558, 438/559, 655, 659, 661, 664, 683

[56] References Cited

U.S. PATENT DOCUMENTS

| | | | |
|---|---|---|---|
| 4,998,157 | 3/1991 | Yokoyama et al. | 357/65 |
| 5,024,954 | 6/1991 | Chen et al. | 437/24 |
| 5,217,924 | 6/1993 | Rodder et al. | 438/533 |
| 5,254,495 | 10/1993 | Luv et al. | 437/200 |
| 5,258,329 | 11/1993 | Shibata | 437/194 |
| 5,536,676 | 7/1996 | Cheng et al. | 438/533 |

FOREIGN PATENT DOCUMENTS

| | | |
|---|---|---|
| 53-084468 | 7/1978 | Japan . |
| 59-181672 | 10/1984 | Japan . |

*Primary Examiner*—John Niebling
*Assistant Examiner*—Thomas G. Bilodeau
*Attorney, Agent, or Firm*—Loudermilk & Associates

[57] ABSTRACT

A method for forming a contact between a conductive layer and a portion of the substrate during manufacture of a semiconductor device is disclosed. The process includes the steps of: (a) covering a semiconductor substrate with an insulating layer, and forming a contact hole on the portion where a contact is to be formed; (b) forming a metal layer on the whole surface of the substrate, and implanting positive ions into the metal layer; and (c) heat-treating the whole substrate so as to form a silicide layer. The metals used are those which can react with silicon to form a silicide, and may be selected from high melting point metals including Co, Ti, Ta, Ni, Mo, and Hf. The ions used are ions including H+ or halogen element ions, and a heat treatment is carried out so that the implanted positive ions may spread on/in the grain boundaries, or that the positive ions may bond with dangling bonds. Further, a silicidation heat treatment is carried out so that the silicide would be formed on the portion where the metal and the silicon substrate contact together. These heat treatments may be carried out simultaneously. The heat treatment for the spreading of the positive ions is carried out at a low temperature of about 300°–500° C., while the heat treatment of the silicidation reaction is carried out at a proper temperature depending on the metal used.

13 Claims, 2 Drawing Sheets

PROCESS FOR FORMATION OF CONTACT CONDUCTIVE LAYER IN A SEMICONDUCTOR DEVICE

This application is a continuation of application Ser. No. 08/547,505 filed on Oct. 24, 1995, now abandoned.

FIELD OF THE INVENTION

The present invention relates to processes for formation of conductive layers in contact holes, thus making contacts for semiconductor devices that are suitable for manufacturing high density semiconductor devices. The present invention also relates to silicide layers that are suitable for manufacturing high density MOS devices.

BACKGROUND OF THE INVENTION

In accordance with the increasing density of semiconductor integrated circuits, the size of unit cells in such devices has been reduced. Further, the width of the gate electrode of transistors has been narrowed, with the result that the contact resistance and the overall resistance have increased.

In an attempt to decrease contact resistance, a technique has been developed in which a metal silicide is formed upon the portion of a silicon substrate on which a contact is to be formed. Thus, the contact resistance of the source or drain of the transistor can be reduced, and further, the problem of lowered speed due to large contact resistance of the transistor can be solved.

There are various types of this technique in which a refractory metal such as Ti, Mo or metal silicon is deposited upon a semiconductor substrate, and a heat treatment is carried out under an atmosphere of $N_2$, $H_2$ or Ar, thereby forming a silicide film. Such a method for forming a Ti silicide layer is illustrated in FIG. 1. According to this method, silicon oxide layer 11, which is formed on impurity diffusion region 15 or silicon substrate 10, is etched to form a contact hole. Then, Ti layer 12 is formed on the overall surface of the wafer, and a heat treatment is carried out to form silicide layer 14. That is, after forming Ti layer 14 on silicon substrate 10, if a heat treatment is carried out, the silicon and titanium bond to form a silicide.

During the heat treatment in the above described conventional technique, Si atoms have superior diffusion characteristics in metal grain boundary 17, and, therefore, silicide layer 14 is more strongly formed on the portion of the substrate which contacts with the grain boundary, with the result that silicide encroachment into the substrate can become severe.

Consequently, the electrical characteristics of the device may be aggravated. That is, the junction leakage current can increased in the contact portion. Further, in the case where a shallow junction method is applied, a junction short may occur due to the junction spike.

If a non-uniform silicide encroachment occurs, a depletion region and a silicide region meet together during operation of the device. Under this condition, there exist defects such as a boundary between the silicide and Si in the depletion region, with the result that the junction leakage current is further increased.

Further, zener breakdown may occur due to the concentration of the electric field on the boundary between the Si and the non-uniformly formed sharp silicide.

SUMMARY OF THE INVENTION

The present invention is intended to overcome the above described disadvantages of the conventional techniques.

Therefore, it is an object of the present invention to provide a process for formation of a contact conductive layer in a semiconductor device, in which the problem of the encroachment of the non-uniform silicide as may occur in the conventional technique is addressed to obtain highly reliable junction electrical characteristics, and dangling bonds of the Si atoms on the passivated junction surface (passivated in the form of a silicon oxide layer) are effectively stabilized, so that the transistor having the silicide contact would be improved as to its reliability and electrical characteristics.

The present invention allows formation of a contact between a conductive layer and a portion of the substrate during a manufacturing of a semiconductor device. An embodiment of the process includes the steps of: (a) covering a semiconductor substrate with an insulating layer, and forming a contact hole on the portion where a contact is to be formed; (b) depositing a metal layer on the overall surface of the substrate, and implanting positive ions into the metal layer; and (c) heat-treating the substrate so as to form a silicide layer.

The metals used are those which can react with silicon to form a silicide, and one may be selected from high melting point metals including Co, Ti, Ta, Ni, Mo, Hf and the like.

The ions used may include hydrogen or halogen element ions, and a heat treatment is carried out so that the implanted positive ions may spread in/on the grain boundaries, or so that the positive ions may bond with the dangling bonds. Further, a silicidation heat treatment is carried out so that the silicide may form on the portion where the metal and the silicon substrate contact together. These heat treatments may be carried out simultaneously.

The heat treatment for the spreading of the positive ions may be carried out at a low temperature of about 300°-500° C., while the heat treatment for the silicidation reaction is carried out at a proper temperature depending on the metal used.

In accordance with the conduction type of the semiconductor device, the positive ions may be selected from among BF2+, BF+, BCl− ions for a P-type device, while the positive ions may be selected from among PH2+ or PH+ ions for an N-type device.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

Figure 1:
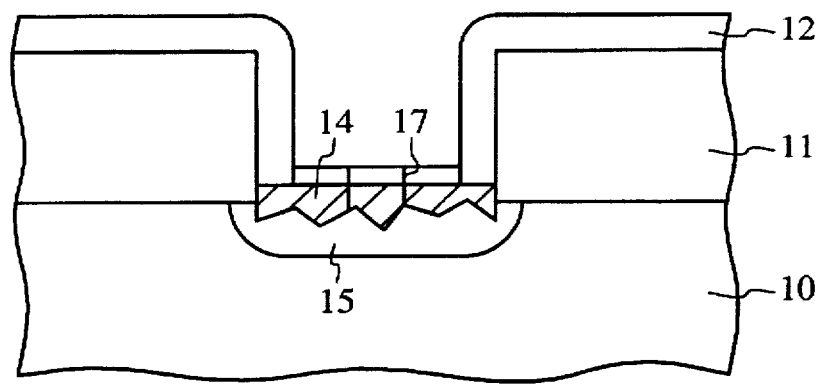
FIG. 1 is a sectional view of a contact portion formed with a conventional semiconductor device contact conductive layer forming method.
Figure 2A:
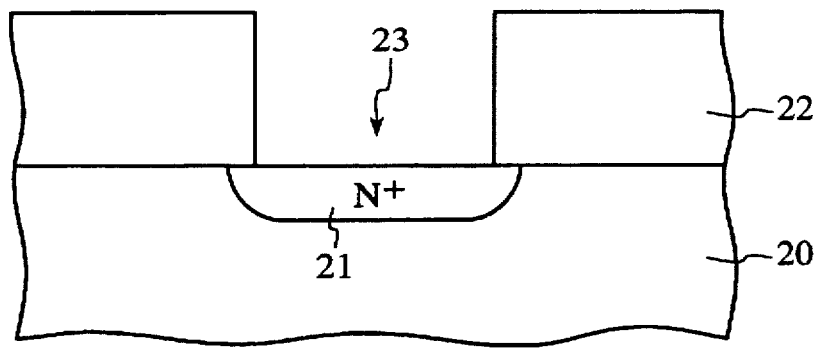
FIGS. 2A to 2D are sectional views illustrating a method for forming a contact conductive layer of a semiconductor device according to the present invention.
Figure 2B:
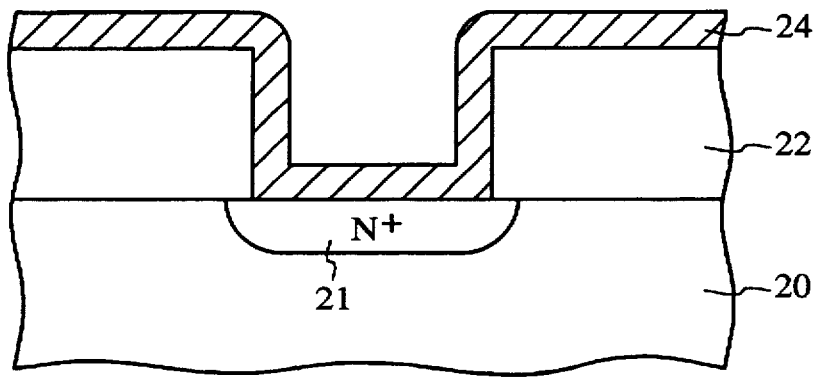

As illustrated in FIG. 2A, impurity doped region 21, in which an N-type or P-type impurity is doped, is formed upon semiconductor substrate 20. The overall surface of substrate 20 is covered with insulating layer 22, and contact hole 23 is formed on the portion where a contact is to be formed. The contact hole is formed by applying a well-known photo etching process.

As illustrated in FIG. 2A, a metal selected from among Ti, Co, Mo, Ta, W, Ni, Hf and the like is coated/formed on silicon substrate 20, thereby forming thin metal layer 24. Such a coating/forming method may be a CVD method or a sputtering method.

Figure 2C:
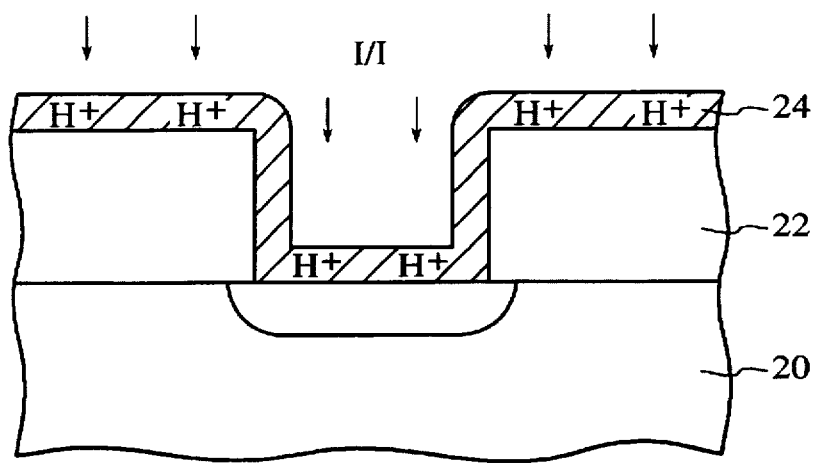

As illustrated in FIG. 2C, a gas source is used to prepare hydrogen-containing ions such as PH2+, PH+, H+ or molecular ions by using an ion accelerating apparatus. These ions are implanted into metal layer 24 upon substrate 20 with an energy of about 80 Kev and a concentration of about $2.0 \times 10^{16}$ ions/CM$^2$.

Figure 2D:
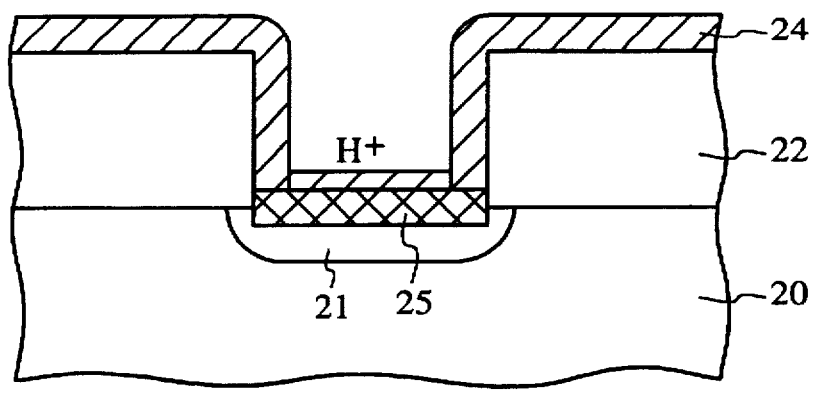

As illustrated in FIG. 2D, a heat treatment is carried out at a temperature of about 400°–450° C. under an atmosphere of $N_2/H_2$, so that the hydrogen ions implanted into the metal layer may rearrange and segregate on/in the grain boundaries, and so that the ions may bond with the dangling bonds of the metal atoms lying on/in the grain boundaries. Then a silicidation heat treatment is carried out at a proper temperature and time in accordance with the selected metal, thereby forming silicide layer 25 between the surface of the substrate and metal layer 24.

Figure 3:
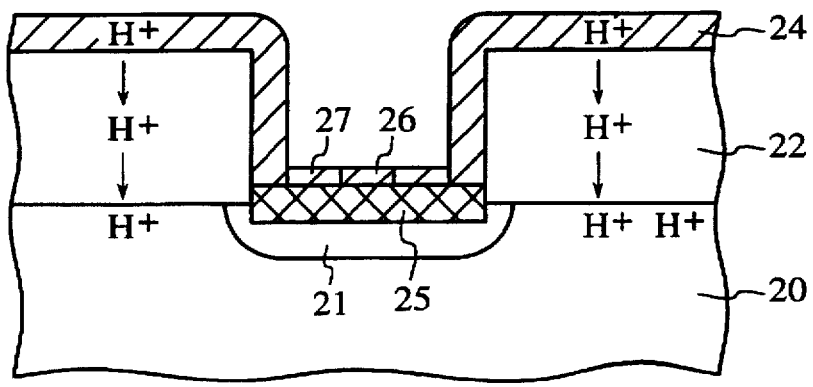
FIG. 3 is a sectional view illustrating the process for forming a contact conductive layer of a semiconductor device according to the present invention.

FIG. 3 is a sectional view of the contact portion for illustrating a process according to the present invention in more detail.

The hydrogen ions which have been implanted into metal layer 24 diffuse through the $SiO_2$ layer, so that the hydrogen ions may bond with the dangling bonds lying on the boundary between oxide layer 22 and silicon substrate 20. Further, the ions also may bond with the dangling bonds lying on/in the metal grain boundaries, and, consequently, the diffusion rate of Si at such a grain boundary may be lowered. Therefore, the diffusion rate both in the inner portion of the grain and at grain boundaries is made more uniform, so that the growth of the silicide may become more uniform.

The method of the present invention applied to the formation of a source and a drain is carried in the following manner. That is, a gate electrode of the transistor is formed on a semiconductor substrate, and a contact hole is formed into an insulating layer. A metal layer is coated/formed on the substrate, and ions (such as $PH_2+$ or PH+ ions for an N-type device, and $BF_2+$ or BF+ ions for a P-type device) are implanted. A heat treatment is carried out, so that the P ions or B ions may diffuse into the substrate to form a junction, and so that H+ ions or F+ ions may bond with the dangling bonds of the metal atoms on the grain boundaries. Thus, the non-uniform diffusion of the Si atoms through the grain boundaries is inhibited, so that the silicide layer formed on the silicon substrate would become more uniform. In this way, a control can be carried out for forming a shallow junction, and the non-uniform encroachment of the silicide layer formed on the substrate can be reduced. Thus the conventional problem of the electrical characteristics of the silicide contacted junction can be substantially improved.

Thus, for the contact structure of a junction having a silicide layer, a uniform silicide layer can be formed, and, therefore, the conventional problems of the junction short and the high junction leakage current as well as the low reliability may be solved. Further, by using a silicide contact of a particular point, good electrical characteristics may be obtained.

Further, the hydrogen ions that are implanted into the metal layer are diffused along the insulating oxide layer during the heat treatment of the silicide, and, therefore, the Si dangling bonds lying on the boundary between the Si and the insulating layer are passivated, so that the junction leakage current would be reduced.

Instead of the implantation of the hydrogen ions which is carried out after the formation of the metal layer, F+ ions or Cl− ions which do not affect the electrical characteristics of the device are implanted into the surface of the metal. In this way, a similar effect may be obtained in the contact.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for forming a contact between a conductive layer and a semiconductor substrate in a semiconductor device, comprising the steps of:

(a) forming an insulating layer on the semiconductor substrate, and removing a portion of the insulating layer for opening a contact hole where the contact is to be formed;

(b) forming a metal layer over the surface of the substrate, and implanting positive ions including hydrogen or halogen ions into the metal layer; and (c) carrying out a heat treatment of the substrate so as to form a silicide layer.

2. The process of claim 1, wherein, at step (b), the metal of the metal layer comprises a material reactive with silicon to form a silicide.

3. The process of claim 2, wherein the metal comprises a metal selected from among Co, Ti, Ta, W, Ni, Mo, and Hf.

4. The process of claim 1, wherein, at step (c), a heat treatment is carried out so that the implanted positive ions spread on/in grain boundaries of the metal layer, and so that the positive ions bond with dangling bonds, and a silicidation heat treatment is carried out so that the silicide layer forms on the portion of the semiconductor substrate where the metal layer contacts the semiconductor substrate.

5. The process of claim 1, wherein, at step (c), a heat treatment is carried out so that the implanted positive ions spread on/in grain boundaries of the metal layer, and so that the positive ions bond with dangling bonds, and simultaneously a silicidation heat treatment is carried out so that the silicide layer forms on the portion of the semiconductor substrate where the metal layer contacts the semiconductor substrate.

6. The process of claim 4, wherein the heat treatment for the spreading of the positive ions is carried out at a temperature of about 300°–500° C.

7. The process of claim 1, wherein, in accordance with the conduction type of the semiconductor device, the positive ions are selected from among $BF_2^+$, $BF^+$, $BCl^+$ ions for a P-type semiconductor device, and the positive ions are selected from among $PH_2^+$ or $PH^+$ ions for an N-type semiconductor device.

8. A process for forming a junction and a contact conductive layer for a semiconductor device, comprising the steps of:

forming an insulating layer on a semiconductor substrate, and forming a contact hole in the insulating layer at a portion of the semiconductor substrate where the contact is to be formed;

depositing a metal layer over the surface of the substrate;

implanting positive ions including hydrogen ions into the metal layer;

carrying out a heat treatment on the substrate, wherein the hydrogen ions spread on/in grain boundaries of the metal layer, and the hydrogen ions bond with dangling bonds at grain boundaries of the metal atoms comprising the metal layer; and carrying out a silicidation heat treatment so as to form a silicide layer on the portion of the substrate where the metal layer contacts the substrate.

9. The process of claim 8, wherein the heat treatment and the silicidation heat treatment are simultaneously carried out in a single step.

10. The process of claim 8, wherein the heat treatment is carried out at a temperature of about 300°–500° C.

11. A process for forming a junction and a contact conductive layer of a semiconductor device, comprising the steps of:

forming an insulating layer on a semiconductor substrate, and forming a contact hole in the insulating layer;

depositing a metal conductive layer on the overall surface;

implanting hydrogen-containing ions or halogen-containing ions into the metal conductive layer;

carrying out a heat treatment for diffusing ions into the substrate so as to form an impurity junction, and for diffusing hydrogen or halogen ions on/in grain boundaries of the metal conductive layer.

12. The process of claim 11, wherein the implanted ions comprise $PH_2$ ions or PH ions, and the heat treatment step comprises the sub-steps of:

decomposing the $PH_2$ ions or PH ions into phosphorus ions and hydrogen ions, wherein the hydrogen ions diffuse on/in the grain boundaries of the metal conductive layer or bond with dangling bonds at grain boundaries of the metal conductive layer; and causing the phosphorous ions to diffuse into the substrate to form an N-type impurity junction, and forming a silicide where the metal conductive layer contacts the substrate.

13. The process of claim 11, wherein the implanted ions comprise $BF_2$, BF, or BCl ions, and the heat treatment step comprises the sub-steps of:

decomposing the $BF_2$, BF, or BCl ions into boron ions and fluorine or chlorine ions, wherein the fluorine or chlorine ions diffuse on/in the grain boundaries of the metal conductive layer or bond with dangling bonds at grain boundaries of the metal conductive layer; and causing the boron ions to diffuse into the substrate to form a P-type impurity junction, and forming a silicide where the metal conductive layer contacts the substrate.

* * * * *

UNITED STATES PATENT AND TRADEMARK OFFICE
CERTIFICATE OF CORRECTION

PATENT NO. : 5,801,086
DATED : September 1, 1998
INVENTOR(S) : Chang Jae Lee

Page 1 of 2

It is certified that error appears in the above-identified patent and that said Letters Patent is hereby corrected as shown below:

Column 4, line 26, "halogen" should be --chlorine--;
Column 4, lines 32-33, "The process of claim 2, wherein the metal comprises a metal selected from among Co, Ti, Ta, W, Ni, Mo, and Hf." should be
--A process for forming a contact between a conductive layer and a semiconductor substrate in a semiconductor device, comprising the steps of:
    (a) forming an insulating layer on the semiconductor substrate, and removing a portion of the insulating layer for opening a contact hole where the contact is to be formed;
    (b) forming a metal layer over the surface of the substrate, wherein the metal comprises a metal selected from among Co, Ti, Ta, W, Ni, Mo, and Hf, and implanting positive ions including hydrogen or halogen ions into the metal layer; and
    (c) carrying out a heat treatment of the substrate so as to form a silicide layer.--;
Column 5, line 21, delete "halogen" and insert --chlorine--;
Column 5, line 25, delete "halogen" and insert --chlorine--;
Column 6, line 1, "The process of claim 11," should be
--A process for forming a junction and a contact conductive layer of a semiconductor device, comprising the steps of:
    forming an insulating layer on a semiconductor substrate, and forming a contact hole in the insulating layers;
    depositing metal conductive layer on the overall surface;
    implanting hydrogen-containing ions or halogen-containing ions into the metal conductive layer;
    carrying out a heat treatment for diffusing ions into the substrate so as to form an impurity junction, and for diffusing hydrogen or halogen ions on/in grain boundaries of the metal conductive layer;--;

UNITED STATES PATENT AND TRADEMARK OFFICE
CERTIFICATE OF CORRECTION

PATENT NO. : 5,801,086
DATED : September 1, 1998
INVENTOR(S) : Chang Jae Lee

It is certified that error appears in the above-identified patent and that said Letters Patent is hereby corrected as shown below:

Column 6, line 15, delete "$BF_2$, BF, or";
Column 6, line 17, delete "$BF_2$, BF, or";
Column 6, line 18, before "chlorine ions", delete "fluorine or";
Column 6, line 18, after "wherein the", delete "fluorine or".
 Column 4, line 54, "are selected from among $BF_2+$, $BF+$" should be --comprise--.

Signed and Sealed this

Twentieth Day of April, 1999

Attest:

Q. TODD DICKINSON

Attesting Officer

Acting Commissioner of Patents and Trademarks